(12) United States Patent
Mambakkam et al.

(10) Patent No.: US 6,859,369 B2
(45) Date of Patent: Feb. 22, 2005

(54) SMARTUNIVERSAL FLASH MEDIA CARD ADAPTERS

(75) Inventors: Sreenath Mambakkam, San Jose, CA (US); Arockiyaswamy Venkidu, Menlo Park, CA (US); Larry Lawson Jones, Palo Alto, CA (US); Simaly Phoukong, Stockton, CA (US)

(73) Assignee: OnSpec Electronic Inc., Santa Clara, CA (US)

( * ) Notice: Subject to any disclaimer, the term of this patent is extended or adjusted under 35 U.S.C. 154(b) by 0 days.

(21) Appl. No.: 10/064,966

(22) Filed: Sep. 4, 2002

(65) Prior Publication Data

US 2004/0032723 A1 Feb. 19, 2004

Related U.S. Application Data

(63) Continuation-in-part of application No. 10/167,929, filed on Jun. 12, 2002, now Pat. No. 6,650,980, and a continuation of application No. 10/002,567, filed on Nov. 1, 2001, and a continuation of application No. 10/039,685, filed on Oct. 29, 2001, which is a continuation-in-part of application No. 09/610,904, filed on Jul. 6, 2000, now Pat. No. 6,438,638.

(51) Int. Cl.[7] .............................................. H05K 7/02
(52) U.S. Cl. ...................... 361/737; 235/492; 439/638
(58) Field of Search ................................ 361/737, 736, 361/752, 730, 796; 439/638, 945, 76.1; 235/492

(56) References Cited

U.S. PATENT DOCUMENTS

| | | | | |
|---|---|---|---|---|
| 5,892,213 A | * | 4/1999 | Ito et al. ..................... | 235/441 |
| 6,102,715 A | * | 8/2000 | Centofante .................. | 439/140 |
| 6,353,870 B1 | * | 3/2002 | Mills et al. ................. | 710/301 |
| 6,402,558 B1 | * | 6/2002 | Hung-Ju et al. ............ | 439/638 |
| 6,490,163 B1 | * | 12/2002 | Pua et al. ................... | 361/737 |
| 6,599,147 B1 | * | 7/2003 | Mills et al. ................. | 439/377 |

* cited by examiner

*Primary Examiner*—Randy W. Gibson
*Assistant Examiner*—Dameon E. Levi
(74) *Attorney, Agent, or Firm*—Blakely Sokoloff Taylor Zafman LLP

(57) ABSTRACT

A multi-memory media adapter comprised of a first planar element having an upper surface and a lower surface, a second planar element having an upper surface and a lower surface, and a spacer disposed between them. The two planar elements form a port capable of receiving a memory media card. The adapter has at least one set of contact pins protruding from the lower surface of the first planar element or the upper surface of the second planar element such that the at least one set of contact pins are disposed within the port. The at least one set of contact pins are capable of contacting the contacts of a memory media card inserted into the port. A third planar element, having a standard system connector surface-mounted thereon, is adjacent to the second planar element. The standard system connecter is electrically connected to the at least one contact pin set.

19 Claims, 5 Drawing Sheets

Connector Pins

| Pin | Smart Media | MMC/SD | Memory Stick |
|---|---|---|---|
| 1 | D0/-WPSW | | |
| 2 | D1 | -WP | |
| 3 | D2 | -CD | |
| 4 | D3 | MCMD | |
| 5 | D4 | | -CD |
| 6 | D5 | | BS |
| 7 | D6 | | SDIO |
| 8 | D7 | | |
| 9 | LVD | | |
| 10 | -WE | D0 | |
| 11 | -RE | D1 | |
| 12 | -ALE | D2 | |
| 13 | -CLE | D3 | |
| 14 | Ready | | |
| 15 | -CE | | |
| 16 | -WP | | |
| 17 | -WPSW | | |
| 18 | Ground | Ground | Ground |
| 19 | Power | | |
| 20 | | Power | Power |
| 21 | | CLK | MCLK |

FIG. 4

SMARTUNIVERSAL FLASH MEDIA CARD ADAPTERS

CLAIM OF PRIORITY

This application is a continuation-in-part application of U.S. application Ser. No. 10/167,929, which was filed on Jun. 12, 2002, now U.S. Pat. No. 6,650,980 which is a continuation application of U.S. application Ser. No. 09/610,904 which was filed Jul. 6, 2000 and issued as U.S. Pat. No. 6,438,638 on Aug. 20, 2002, and is titled "Flashtoaster for reading several types of flash MemoryCards with or without a PC" and copending U.S. applicaton Ser. No. 10/039,685 which was filed Oct. 29, 2001 and is titled, "Flashtoaster for reading several types of flash MemoryCards with or without a PC" and copending U.S. application Ser. No. 10/002,567 which was filed Nov. 1, 2001 and is titled, "Active Adapter Chip for Use in a Flash Card Reader", the priority of which is hereby claimed, and the entirety of which are incorporated herein by this reference, and all of which are assigned to the assignee of the present invention.

COPYRIGHT NOTICE/PERMISSION

A portion of the disclosure of this patent document contains material which is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present invention relates generally to flash media adapters, and more specifically to an improved configuration of the same.

BACKGROUND

In U.S. patent application Ser. No. 10/002,567, entitled "Active Adapter Chip for Use in a Flash Card Reader", filed Nov. 1, 2001, and assigned to the assignee of the present application, a universal active adapter chip is disclosed that can be used to construct a flash media system or various active flash media adapters using the CompactFlash card or PCMCIA (PC Card) form factor. A standard reader that reads CompactFlash cards or PC cards can then read any of the other flash-memory cards that plug into the CompactFlash or PC Card adapter. The adapters come with a conversion chip that makes each of the flash media work just like a CompactFlash or PC Card media, as applicable.

FIG. 1 shows a multi-standard card reader system 142. In the field of multi-standard adapters, multi-memory media adapter 140 may be an active adapter or, alternatively may be a passive adapter. Reader 142 can adapt on the host side to either CompactFlash card 149, PCMCIA card 153, or IDE card 151. On the media side, the reader can adapt to a MultiMediaCard 141, or a Secure Digital card 143, which have the same form factor but slightly different pin-out; a SmartMedia card 145, which has a different pin-out; or a Memory Stick 147. In general the reader 142 can adapt to any generic flash media 146 that has a similar or smaller form factor.

It is possible to place the connector such that all the media sit in one opening. FIG. 2 is a cutaway side view of a PCMCIA adapter card 200 of the type that is available as a standard commercial product today. FIG. 2 illustrates several drawbacks in the typical configuration of a PCMCIA Adapter. Adapter 200 includes two PCBs, namely PCB 210 and PCB 220. The two PCBs are separated by a mounting frame (typically plastic), not shown. The mounting frame acts as a spacer between PCB 210 and PCB 220, which holds the two PCBs together at a specified distance and functions in other capacities as described below. The space between the two PCBs creates the opening (port) 211 into which the flash media cards are inserted. PCB 230 is straddle-mounted between PCB 210 and PCB 220. PCB 230 contains the active components including controller chip 231 that perform handshaking and data transfer. PCB 230 is connected to a PCMCIA connector 240. PCB 230 is mounted between PCB 210 and PCB 220 with interconnects 212. PCB 210 has two sets of floating contact pins, contact pin set 214 includes nine contact pins and contact pin set 215 includes ten contact pins, which provide interfaces for MMC/SD and Memory-Stick flash media respectively. PCB 220 has two sets of floating contact pins 224 and 225, each including 11 pins, which together provide the interface for SmartMedia flash media.

The mounting frame that holds PCB 210 and 220 together is configured such that each type of flash media is inserted in a particular location within the connector. In FIG. 2, opening 211 a simplified view. Typically the opening is stepped, with different widths and heights in different locations that index the flash media cards into specific locations upon insertion. This allows each flash medium to be properly aligned with the corresponding contact pin set(s). Additionally, stops are typically provided to stop the insertion at the correct depth, again, to guarantee connection to the right contact pin set.

This typical approach has several serious drawbacks.
Manufacturing

The straddle-mount configured flash media adapter is very expensive to manufacture for several reasons. Often such devices require manual labor for manufacturing and testing, or the use of very expensive soldering robots, instead of standard product techniques. A further problem is the additive effect of manufacturing tolerances, such as primary connector (i.e., PCMCIA) to PCB, to straddle mount connector to secondary PCB to contacts on PCB, result in as many as two, three, or in some cases even four tolerances adding up, which makes requirements for tolerances either absurdly expensive, or causes a big yield problem in manufacturing. Additionally, PCB 230 must be thin enough so that it can be mounted between PCB 210 and PCB 220 in the space allocated for the insertion of the various flash media. That is, PCB 230, together with the interconnects 212 that mount it between PCB 210 and PCB 220 must be no larger than opening 211. The manufacture of thin PCBs to accommodate this design point adds to the expense and complexity of manufacturing the flash media adapter.
Contact pins The floating contact pins are subject to damage and deterioration. The various flash media cards have different thickens, and even the same flash media may have different thickness if produced by different manufacturers. The flash media cards exert pressure upon the floating contact pins, which eventually causes their resiliency to be reduced. When subsequently, a thinner flash media card is inserted into the flash media adapter, the corresponding contact pins may not make connection with the flash media card. Additionally if a flash via card is inserted incorrectly (e.g., upside down), removal of the flash media card may damage the contact pins.
Interface Some devices don't have the 68-pin PCMCIA interface. For example, some recent notebook computer models only have the electrically equivalent 50-pin CF interface. Typical adapter cars such as PCMCIA adapter card 200 are incompatible with a 50-pin CF interface.

An embodiment of the present invention provides a multi-memory media adapter comprised of a first planar element having an upper surface and a lower surface, a second planar element having an upper surface and a lower surface, and a spacer disposed between them. The two planar elements form a port capable of receiving a memory media card. The adapter has at least one set of contact pins protruding from the lower surface of the first planar element or the upper surface of the second planar element such that the at least one set of contact pins are disposed within the port. The at least one set of contact pins are capable of contacting the contacts of a memory media card inserted into the port. A third planar element, having a standard system connector surface-mounted thereon, is adjacent to the second planar element. The standard system connecter is electrically connected to the at least one contact pin set.

Other features and advantages of embodiments of the present invention will be apparent from the accompanying drawings, and from the detailed description, that follows below.

BRIEF DESCRIPTION OF THE DRAWINGS

The invention may be best understood by referring to the following description and accompanying drawings that are used to illustrate embodiments of the invention. In the drawings:

FIG. 4 is a table of pin mappings for the SmartMedia, MMC/SD, and Memory Stick to a 21-pin connector in accordance with one embodiment of the present invention.

DETAILED DESCRIPTION

Figure 1:
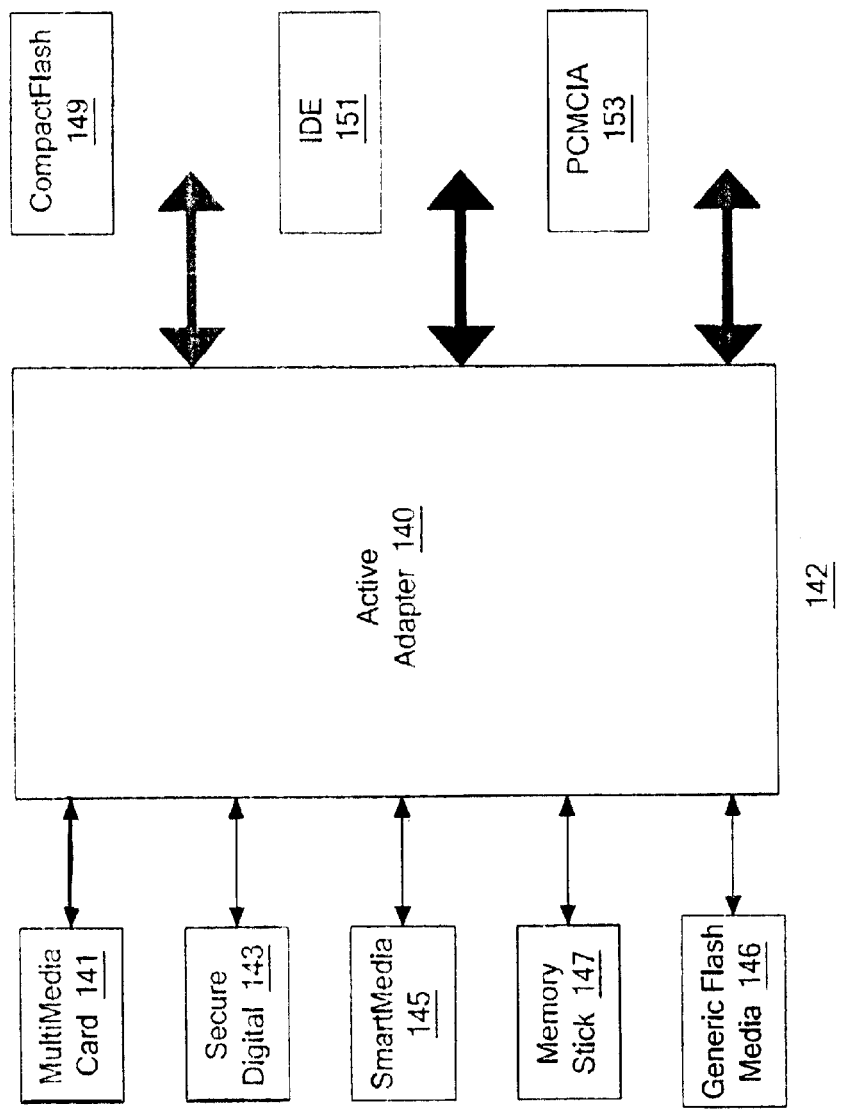
FIG. 1 illustrates multi-standard card reader system.
Figure 2:
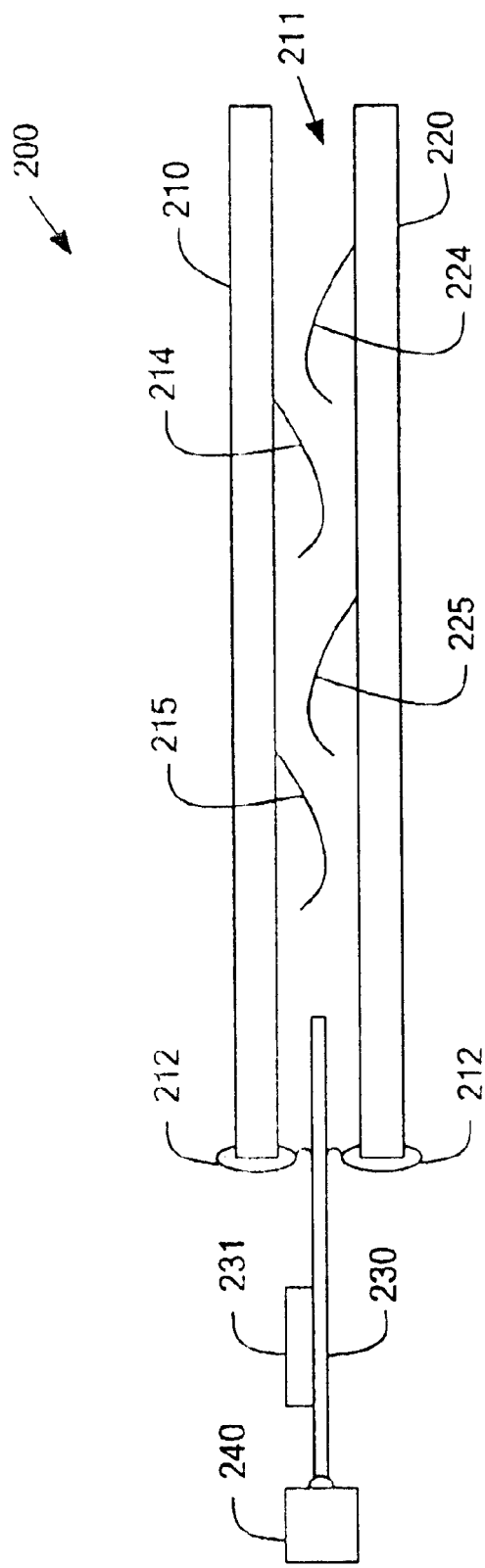
FIG. 2 is a cutaway side view of a PCMCIA adapter card of the type that is available as a standard commercial product today.

Am embodiment of the present invention provides a multi-memory media adapter card configured to reduce or eliminate some of the drawbacks of typical adapter card configuration. In accordance with various embodiments of the present invention, the top and bottom PCBs of prior art configurations am replaced by molded plastic elements that provide greater structural integrity. The straddle-mounted controller board is replaced with a PCB adjacent to the bottom element and having a surface mounted standard connector that may be a PCMCIA or a CompactFlash connector. The contact pins are formed so as to better maintain their resiliency and avoid damage upon removal of the memory media card. In one embodiment, a light pipe is locked in place between the top and bottom elements of the adapter card so as to conduct light from a signal lamp on the PCB through the port.

It is an intended advantage of one embodiment of the present invention to reduce the manufacturing cost and complexity of an adapter card. It is another intended advantage of one embodiment of the present invention to provide an adapter card with greater structural integrity. It is another intended advantage of one embodiment of the present invention to provide am adapter card with contact pins that retain their resiliency to a greater degree than floating contact pins. It is another intended advantage of one embodiment of the present invention to provide an adapter card with contact pins that are less likely to be damaged upon removal of a memory media card. It is another intended advantage of one embodiment of the present invention to provide an adapter card with a surface mounted standard connector including PCMCIA and CompactFlash connectors.

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Figure 3:
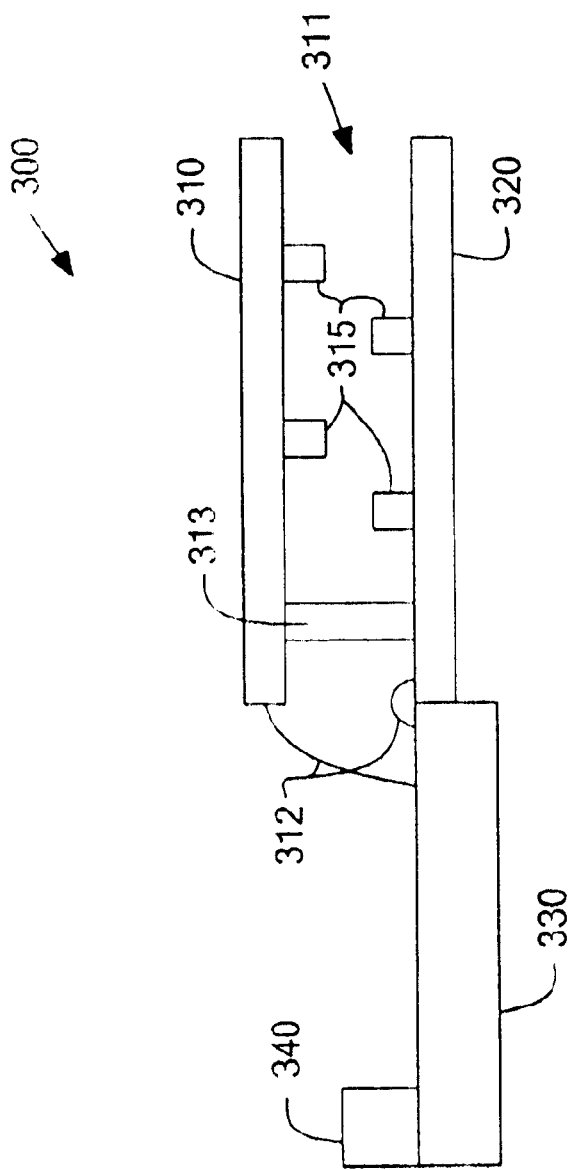
FIG. 3 is a cutaway side view of an integrated standard connector adapter card according to one embodiment of the present invention.

FIG. 3 is a cutaway side view of an integrated standard connector adapter card according to one embodiment of the present invention. Adapter card 300 shown in FIG. 3 includes a top planar element 310 and a bottom planar element 320, both of which may be PCBs. Alternatively, the top planar element 310 and the bottom planar element 320 may be formed from molded plastic. A spacer 313, holds the two planar elements apart, forming port 311 into which memory media cards are inserted. Typically the spacer 313 may be more extensive than shown in FIG. 3. For example, for one embodiment the spacer may extend the entire length of the planar elements. In order to meet the low height requirements (thickness of PCMCIA or CF cards), the ports are registered on one opening, and contacts are distributed on both sides. Additionally, the port 311 may be formed with card stops to prevent improper insertion of memory media cards.

Figure 5:
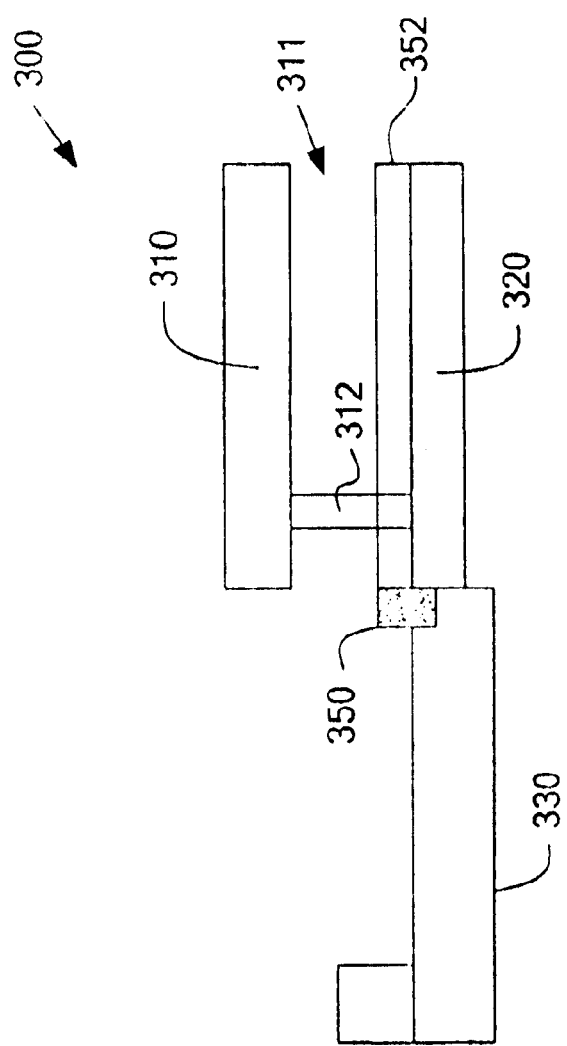
FIG. 5 is a cutaway side view of an integrated standard connector adaptor card to one embodiment of the present invention.

FIG. 5 is a cutaway side view of an integrated standard connector adapter card according to one embodiment of the present invention.

For one embodiment, both planar elements and the spacer between them are created from molded plastic. For such an embodiment, the molded plastic provides greater resistance to pressure applied to the outer surface of adapter card 300. This helps to prevent planar element 310 and planar element 320 from contacting each other and possibly damaging internal components.

Adapter 300 also includes a number of sets of contact pins, shown collectively as contact pin set 315, protruding from the lower surface of planar element 310 and from the upper surface of planar element 320. The contact pins electrically couple to corresponding contacts on a memory media card inserted into port 311. For an embodiment in which the planar elements 310 and 320 are formed from molded plastic, contact pin sets 315 nay be formed from injected contacts with protruding pins. This provides a more robust contact pin than the floating contact pins of the prior art, thereby lessening the likelihood that the resiliency of the contact pin will be reduced to the point that the pin no longer contacts the inserted memory media card. Alternatively, or additionally, the contact pins may be angled or shaped such that damage due to the abrupt removal of an improperly (or properly) inserted card is reduced or eliminated. For example the terminal end of the contact pin may be angled or curved toward the planar surface from which the contact pin protrudes, or may be spherically shaped.

Adapter 300 includes planar element 330 that has standard connector 340 mounted thereon. Planar element 330 is adjacent to bottom planar element 320. Standard connector 340, which may be for example, a compact flash or PCMCIA connector is surface-mounted to planar element 330. Interconnects 312 that electrically connect the standard connector 340 to contact pins 315 are also located on planar element 330. In accordance with an embodiment of the present invention, the need for a straddler-mounted PCB, and its associated manufacturing costs and complexity is eliminated. Moreover, by eliminating the layers of a straddle-mount configuration, registration accuracy is improved. For one embodiment, a single PCB may comprise bottom planar element 320 and planar element 330.

For one embodiment a multi-memory media adapter having only 21 pins is used to accommodate various commercially available flash memory media. FIG. 4 is a table of pin mappings for the SmartMedia, MMC/SD, and Memory Stick to a 21-pin connector in accordance with on embodiment of the present invention.

Pin 18 is a ground pin for each connector. Pin 19 is a power pin for SmartMedia, while pin 20 is a power pin for MMC/SD, and Memory Stick.

The SmartMedia interface has a parallel data bus of 8 bits. These are mapped to pins 1–8. While no separate address bus is provided, address and data are multiplexed. Control signal for latch enables, write enable and protect, output enable, and ready handshake are among the control signals For the Memory Stick and MMC/SD flash-memory-card interfaces, parallel data or address busses are not present. Instead, serial data transfers occur through serial data pin DIO, which is mapped to pin 7 for the Memory Stick, and pin 10 (DO) for the MMC/SD flash-memory-card interfaces. Data is clocked in synchronization to clock MCLK and CLK, for Memory Stick and MMC/SD, respectively, on pin 21. A BS, for Memory Stick, occupies pin 6 and a command signal CMD, for MMC/SD occupies pin 4. The Memory Stick interfaces require only 4 pins plus power and ground, while MMC/SD requires 8 pins plus power and ground.

Thus it is possible to accommodate SmartMedia, MMCID, and Memory Stick with a 21-pin connector (i.e., instead of 41 pins) by multiplexing the available pins. Four one embodiment, the controller chip (e.g., controller chip 231) differentiates the pin configuration for each flash memory media type.

General Matters

Embodiments of the present invention provide an improved configuration for a multi-memory media adapter card. For one embodiment, the adapter may comprise an injected plastic part, forming the mechanical port, as well as holding any and all contacts in its structure, thus eliminating the multiple tolerances of conventional configurations (i.e., two PCBs sandwiching a mechanical frame). For one embodiment, two half shells with integrated contacts are snapped together, allowing for a simple, but accurate mounting by means of guides for snapping them together. In particular, the total assembly of the port may be composed of two parts, a top and bottom, each with contacts and plastic, each containing part or all of the port opening, hence reducing the number of added tolerances to a maximum of one or two. By reducing the number of sub-assemblies from three or more to two or less, an easier, more precise manufacturing can be done, with only slightly higher tooling cost. However, due to the fact that it is a high-volume, commodity-type device, the higher tooling costs would be more than offset by the lower part cost, the better yield, etc. Further, by embedding the contacts in a plastic injection, such problems as metal fatigue, travel, etc., can be controlled much better, improving dramatically the life-cycle time for the port side connectors.

For one embodiment, as illustrated in FIG. 5, a light pipe 352 may be locked in place between the first planar element 310 and the second planar element 320 such that light from a signal lamp 350 (e.g., LED) located on the third planar element 330 (PCB) is conducted through the port 311.

For one embodiment, the straddle-mount configuration is replaced with a surface mounted standard connector. This reduces the manufacturing costs and complexities associated with the straddle-mount configuration.

Embodiments of the present invention have been in reference to standard flash media such as MultiMediaCard, Secure Digital, SmartMedia, and Memory Stick. In general, embodiment of the invention are applicable to any generic flash media that has a similar or smaller form factor.

While the invention has been described in terms of several embodiments, those skilled in the art will recognize that the invention is not limited to the embodiments described but can be practiced with modification and alteration within the spirit and scope of the appended claims. The description is thus to be regarded as illustrative instead of limiting.

What is claimed is:

1. A multi-memory media adapter comprising:
    a first planar element having an upper surface and a lower surface;
    a second planar element having an upper surface and a lower surface;
    a spacer disposed between the first planar element and the second planar element such that a port is formed between the lower surface of the first planar element and the upper surface of the second planar element, the port capable of receiving a memory media card;
    a first set of nine contact pins protruding from the lower surface of the first planar element,
    a second set of ten contact pins protruding from the lower surface of the first planar element,
    a third set of eleven contact pins protruding from the upper surface of the second planar element,
    a fourth set of eleven contact pins protruding from the upper surface of the second planar element; and
    a third planar element, adjacent to the second planar element, the third planar element having a standard system connector surface-mounted thereon, the standard system connector electrically connected to at least one of the set of contact pins.

2. The multi-memory media adapter of claim 1 wherein the first planar element and the second planar element are formed from molded plastic.

3. The multi-memory media adapter of claim 1 wherein the second planar element and the third planar element comprise a single PCB.

4. The multi-memory media adapter of claim 2 wherein the port contains multiple registrations, each registration corresponding to a memory media card type.

5. The multi-memory media adapter of claim 4 wherein the memory media card type is selected from the group consisting of SmartMedia card, MultiMediaCard, Secure Digital card, Memory Stick, and a flash media having similar form factor.

6. The multi-memory media adapter of claim 1 wherein the standard system connector is selected from the group consisting of a PCMCIA connector, an IDE and a CompactFlash connector.

7. The multi-memory media adapter of claim 2 wherein the contact pins are integrated within the molded plastic.

8. The multi-memory media adapter of claim 1 wherein the contact pins are formed such that contact pin resiliency is retained.

9. The multi-memory media adapter of claim 1 wherein the contact pins are formed such that the terminal end of the contact pin is pushed away from the memory media card contact thereby helping to prevent the contact pin from being damaged during removal of the memory media card.

10. The multi-memory media adapter of claim 1 having 21 contact pins configured to accommodate a SmartMedia card, a MultiMediaCard, a Secure Digital card, and a Memory Stick.

11. The multi-memory media adapter of claim 10, wherein a controller chip is used to differentiate a pin configurations for each of the SmartMedia card, a MultiMediaCard, a Secure Digital card, and a Memory Stick.

12. The multi-memory media adapter of claim 7 wherein a light pipe is locked between the first planar element and the second planar element such that light from a signal lamp located on the third planar element is conducted through the port.

13. A system comprising:

a multi-memory media adapter capable to read data from each of a plurality memory media, the multi-memory media adapter formed such that a port is formed between an upper portion and a lower portion of the multi-memory media adapter, the port capable of receiving a memory media card, the multi-memory media adapter having: a first set of nine contact pins protruding from the lower surface of the first planar element, a second set of ten contact pins protruding from the lower surface of the first planar element, a third set of eleven contact pins protruding from the upper surface of the second planar element, a fourth set of eleven contact pins protruding from the upper surface of the second planar element; and a standard system connector to transmit data to a digital processing system, the standard system connector surface-mounted on an adjacent portion of the multi-memory media adapter adjacent to the lower portion, the standard system connector electrically connected to at least one of the set of contact pins.

14. The system of claim 13 wherein the multi-memory media adapter is formed from a molded material.

15. The system of claim 13 wherein the port contains multiple registrations, each registration corresponding to a memory media card type.

16. The multi-memory media adapter of claim 15 wherein the memory media card type is selected from the group consisting of SmartMedia card, MultiMediaCard, Secure Digital card, Memory Stick, and a flash media having similar form factor.

17. An apparatus comprising:

a first element formed from molded plastic;

a second element formed from molded plastic and coupled to the first element such that a port is formed between the first element and the second element, the port capable of receiving a memory media card;

a first set of nine contact pins protruding from the lower surface of the first planar element, a second set of ten contact pins protruding from the lower surface of the first planar element, a third set of eleven contact pins protruding from the upper surface of the second planar element, a fourth set of eleven contact pins protruding from the upper surface of the second planar element; and a third element, adjacent to the second element, the third element having a standard system connector surface-mounted thereon, the standard system connector electrically connected to at least one of the set of contact pins.

18. The apparatus of claim 17 wherein the port contains multiple registrations, each registration corresponding to a memory media card type selected from the group consisting of SmartMedia card, MultiMediaCard, Secure Digital card, Memory Stick, and a flash media having similar form factor.

19. The multi-memory media adapter of claim 18 wherein the set contact pins comprises 21 contact pins, the 21 contact pins integrated within the molded plastic and configured to accommodate a SmartMedia card, a MultiMediaCard, a Secure Digital card, and a Memory Stick.

* * * * *

UNITED STATES PATENT AND TRADEMARK OFFICE
CERTIFICATE OF CORRECTION

PATENT NO. : 6,859,369 B2
DATED : February 22, 2005
INVENTOR(S) : Mambakkam et al.

It is certified that error appears in the above-identified patent and that said Letters Patent is hereby corrected as shown below:

Column 2,
Line 34, delete "product" and insert -- production --.
Line 37, delete "result" and insert -- resulting --.
Line 64, delete "cars" and insert -- cards --.

Column 3,
Line 45, delete "am" and insert -- are --.
Line 61, delete "am" and insert -- an --.

Signed and Sealed this

Seventh Day of June, 2005

JON W. DUDAS
*Director of the United States Patent and Trademark Office*

UNITED STATES PATENT AND TRADEMARK OFFICE
CERTIFICATE OF CORRECTION

PATENT NO. : 6,859,369 B2
DATED : February 22, 2005
INVENTOR(S) : Mambakkam et al.

It is certified that error appears in the above-identified patent and that said Letters Patent is hereby corrected as shown below:

<u>Title page,</u>
Item [54], Title, delete "SMARTUNIVERSAL" and insert -- SMARTCONNECT UNIVERSAL --.

Signed and Sealed this

Seventh Day of March, 2006

JON W. DUDAS
*Director of the United States Patent and Trademark Office*

UNITED STATES PATENT AND TRADEMARK OFFICE
CERTIFICATE OF CORRECTION

PATENT NO. : 6,859,369 B2  Page 1 of 1
APPLICATION NO. : 10/064966
DATED : February 22, 2005
INVENTOR(S) : Sreenath Mambakkam et al.

It is certified that error appears in the above-identified patent and that said Letters Patent is hereby corrected as shown below:

On the Title Page, replace the "Related U.S. Application Data" section with the following,
--Continuation-in-part of application No. 10/002,567, filed on Nov. 1, 2001, and a continuation-in-part of application No. 10/039,685, filed on Oct. 29, 2001, and a continuation-in-part of application No. 10/167,925, filed on Jun. 11, 2002, now Pat. No. 7,222,205, which is a continuation of application No. 09/610,904, filed on Jul. 6, 2000, now Pat. No. 6,438,638.--

In Column 1,
Lines 6-7, replace "U.S. application Ser. No. 10/167,929, which was filed on June 12, 2002, now U.S. Pat. No. 6,650,980" with --U.S. application Ser. No. 10/167,925, which was filed on June 11, 2002, now U.S. Pat. No. 7,222,205--

In Column 1,
Line 12, replace "and co-pending U.S. application Ser. No. 10/039,685" with --and this application is a continuation-in-part of co-pending U.S. application Ser. No. 10/039,685--

In Column 1,
Line 15, replace "and co-pending U.S. application Ser. No, 10/002,567" with --and this application is a continuation-in-part of co-pending U.S. application Ser. No. 10/002,567--

Signed and Sealed this

Twenty-second Day of June, 2010

David J. Kappos
*Director of the United States Patent and Trademark Office*